US010020398B1

(12) United States Patent
Cheng et al.

(10) Patent No.: US 10,020,398 B1
(45) Date of Patent: Jul. 10, 2018

(54) STRESS INDUCTION IN 3D DEVICE CHANNEL USING ELASTIC RELAXATION OF HIGH STRESS MATERIAL

(71) Applicant: INTERNATIONAL BUSINESS MACHINES CORPORATION, Armonk, NY (US)

(72) Inventors: Kangguo Cheng, Schenectady, NY (US); Nicolas J. Loubet, Guilderland, NY (US); Xin Miao, Guilderland, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/403,285

(22) Filed: Jan. 11, 2017

(51) Int. Cl.
| *H01L 27/088* | (2006.01) |
| *H01L 29/78* | (2006.01) |
| *H01L 29/06* | (2006.01) |
| *H01L 21/306* | (2006.01) |
| *H01L 29/66* | (2006.01) |

(52) U.S. Cl.
CPC .... *H01L 29/7849* (2013.01); *H01L 21/30604* (2013.01); *H01L 29/0665* (2013.01); *H01L 29/66795* (2013.01); *H01L 29/785* (2013.01); *H01L 29/7848* (2013.01)

(58) Field of Classification Search
CPC .............. H01L 29/7849; H01L 29/785; H01L 29/66795; H01L 29/0665; H01L 21/30604; H01L 29/7848

USPC .......................................................... 257/401
See application file for complete search history.

(56) References Cited

U.S. PATENT DOCUMENTS

| 4,120,706 | A | 10/1978 | Mason |
| 4,159,214 | A | 6/1979 | Mason |
| 4,180,825 | A | 12/1979 | Mason |
| 8,723,266 | B2 | 5/2014 | Tsai et al. |
| 8,952,420 | B1 * | 2/2015 | Loubet ................. H01L 29/7848 257/192 |
| 8,975,142 | B2 | 3/2015 | Paul et al. |
| 9,245,953 | B2 | 1/2016 | Loubet et al. |
| 9,406,777 | B2 | 8/2016 | Lee et al. |
| 9,773,871 | B2 * | 9/2017 | Chang ................. H01L 29/1083 |
| 2014/0319614 | A1 | 10/2014 | Paul et al. |
| 2015/0028349 | A1 | 1/2015 | Loubet et al. |
| 2015/0140760 | A1 | 5/2015 | Loubet et al. |
| 2015/0287807 | A1 * | 10/2015 | Lee ................... H01L 29/66545 438/285 |
| 2016/0111337 | A1 * | 4/2016 | Hatcher ............ H01L 21/82380 438/154 |
| 2016/0172497 | A1 | 6/2016 | Loubet et al. |

* cited by examiner

*Primary Examiner* — Vu A Vu
(74) *Attorney, Agent, or Firm* — Tutunjian & Bitetto, P.C.; Rabin Bhattacharya

(57) ABSTRACT

A method for inducing stress in a device channel includes forming a stress adjustment layer on a substrate, the stress adjustment layer including an as deposited stress due to crystal lattice differences with the substrate. A device channel layer is formed on the stress adjustment layer. Cuts are etched through the device channel layer and the stress adjustment layer to release the stress adjustment layer to induce stress in the device channel layer. Source/drain regions are formed adjacent to the device channel layer.

18 Claims, 16 Drawing Sheets

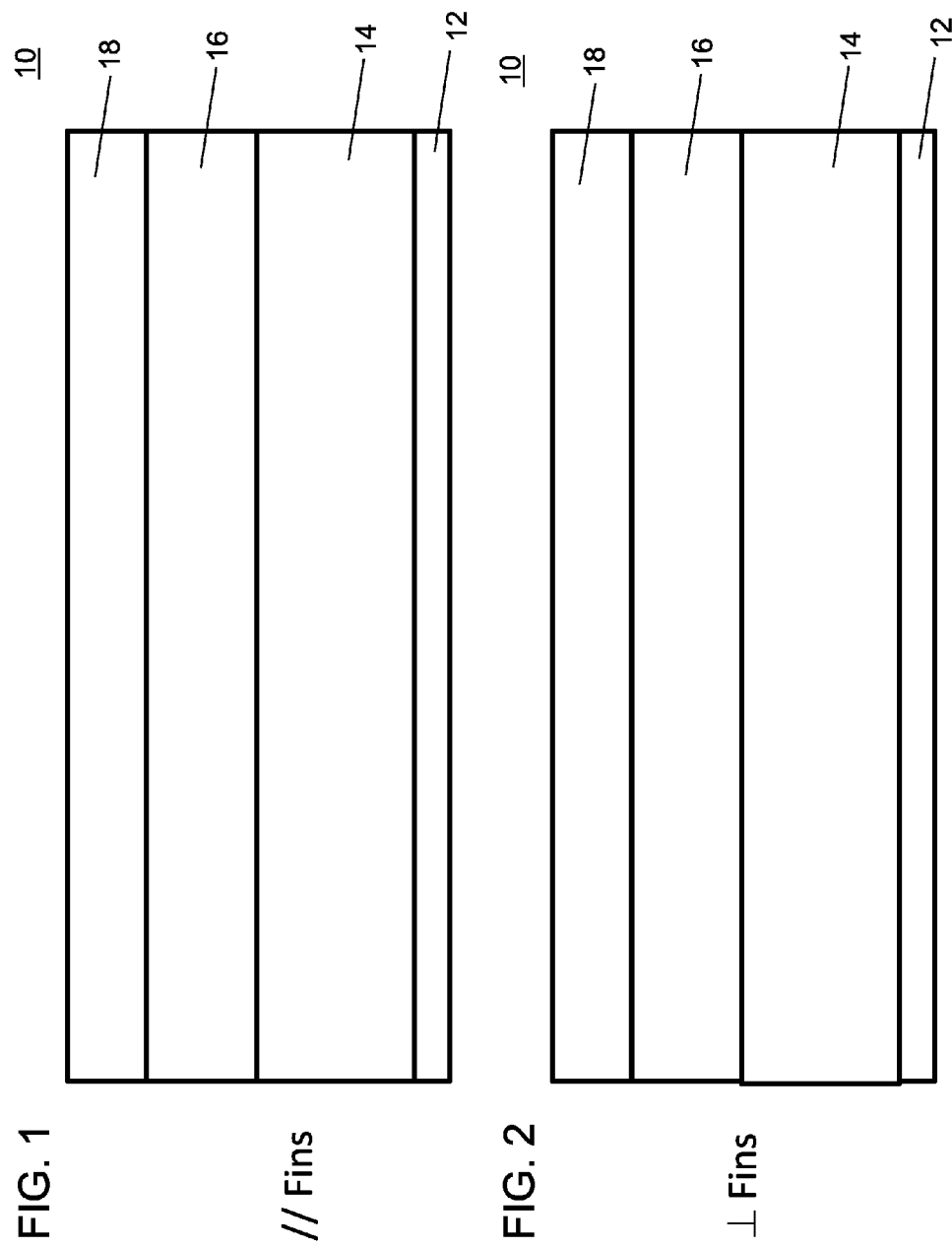

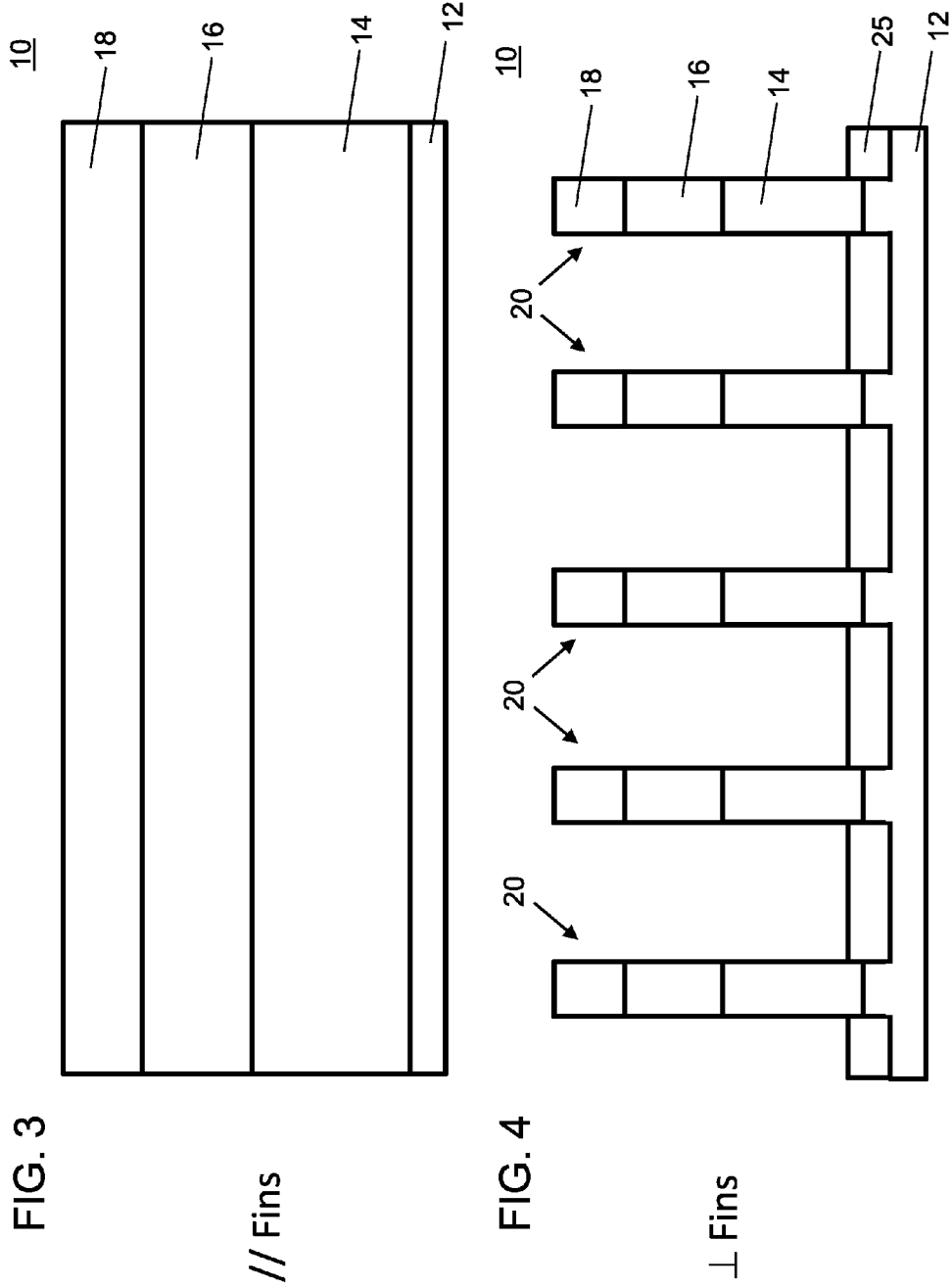

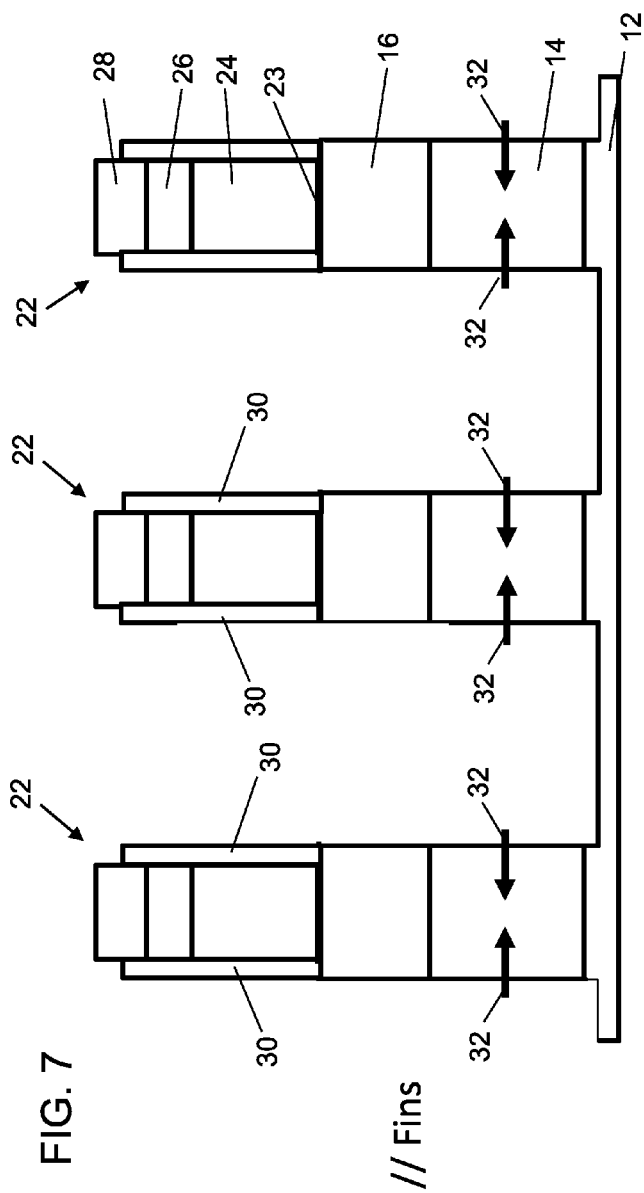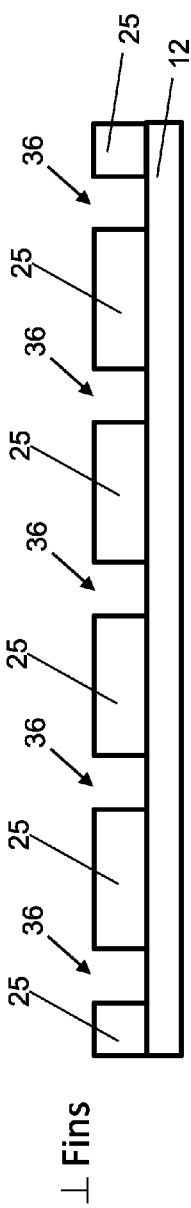
FIG. 7
// Fins
FIG. 8
⊥ Fins

// Fins

⊥ Fins

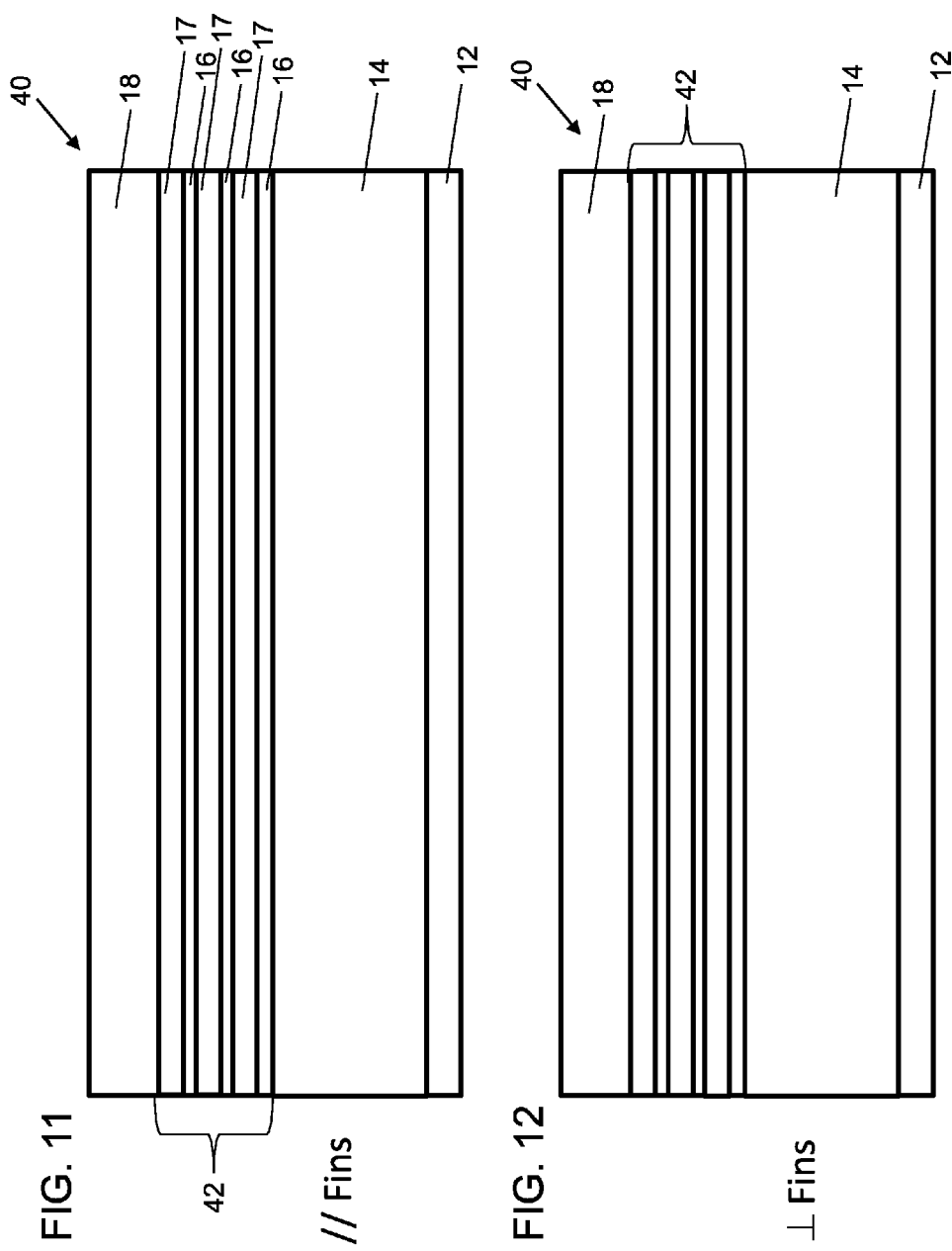

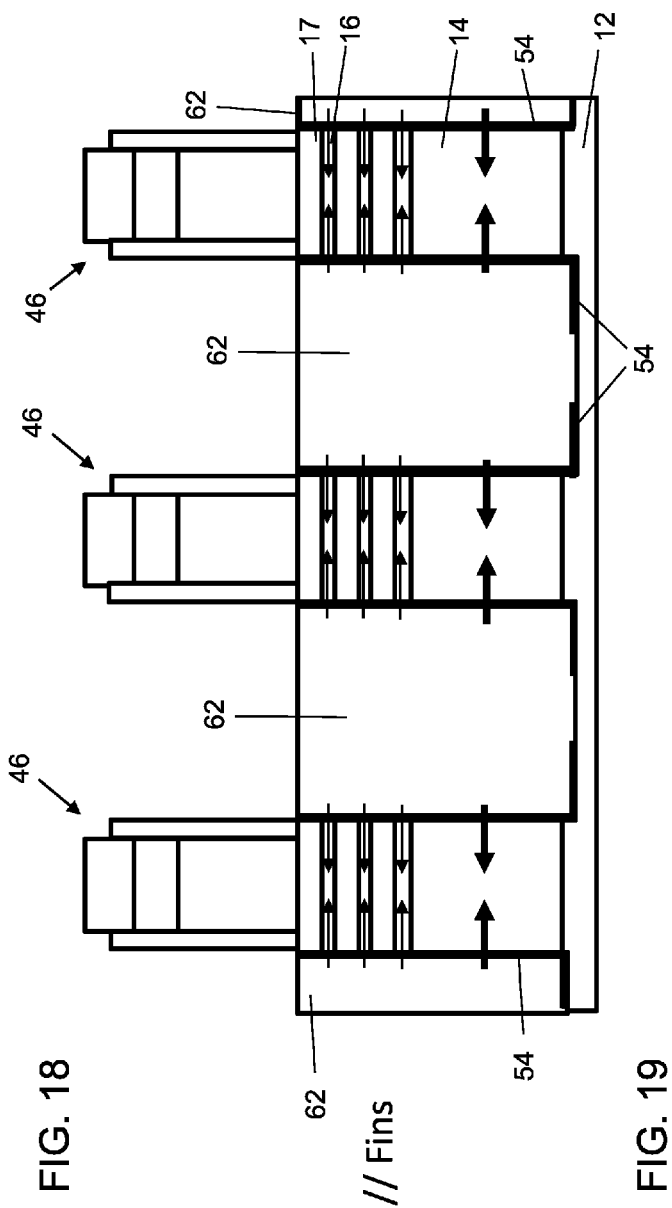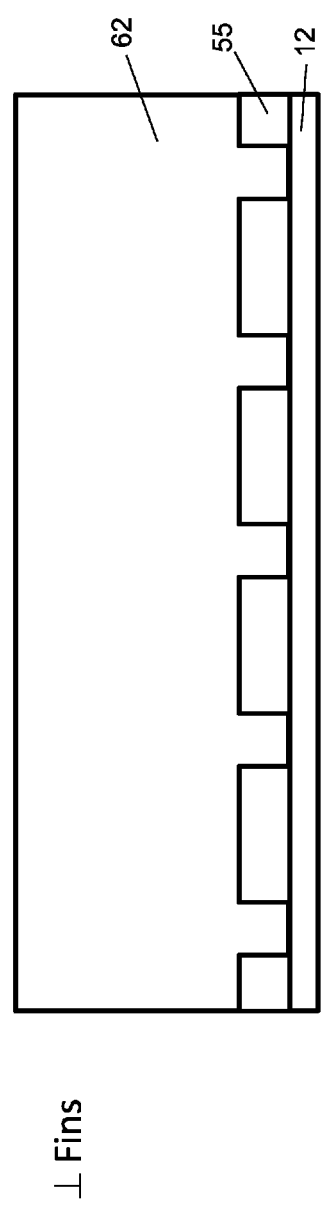

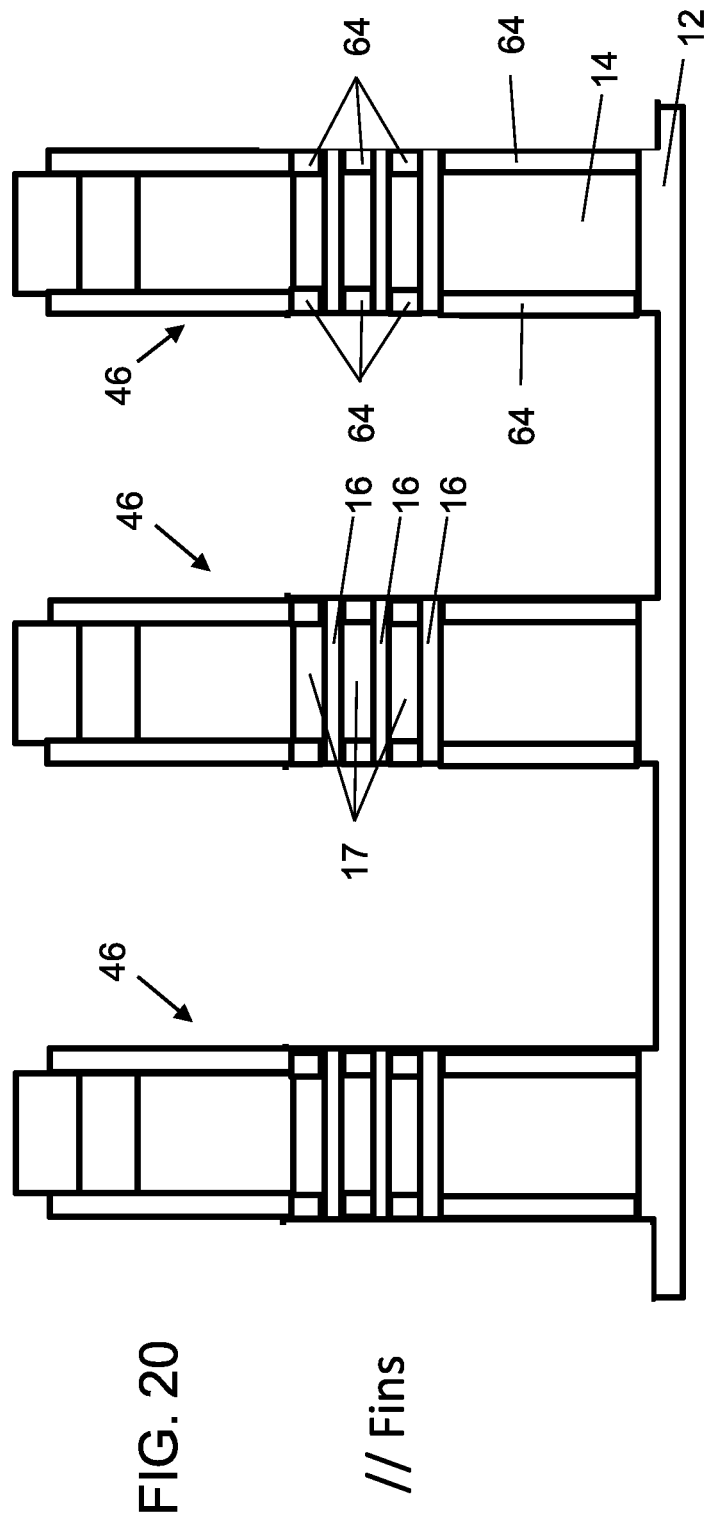

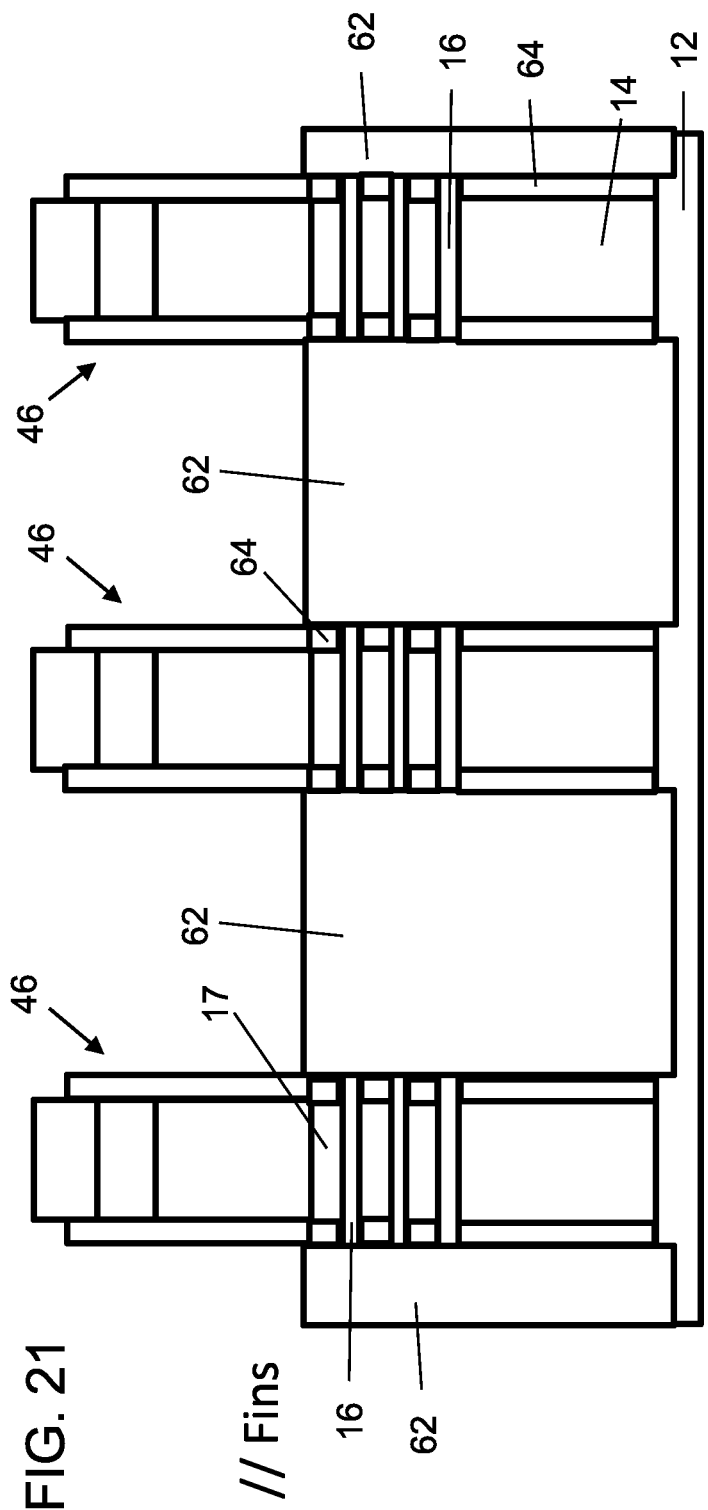

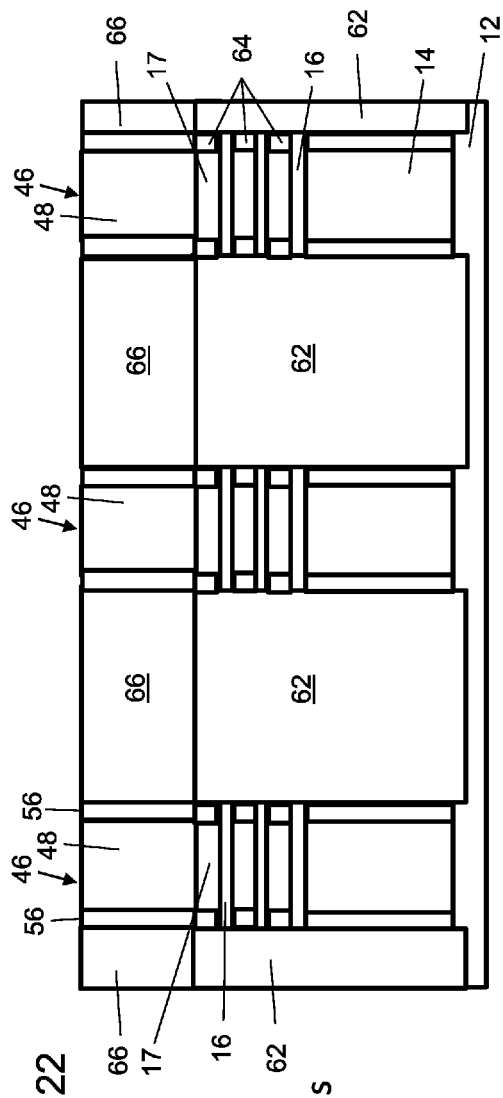

// Fins

⊥ Fins

// Fins

⊥ Fins

STRESS INDUCTION IN 3D DEVICE CHANNEL USING ELASTIC RELAXATION OF HIGH STRESS MATERIAL

BACKGROUND

Technical Field

The present invention generally relates to semiconductor devices, and more particularly to substrates and methods for fabrication that yield a compressive strain employed for formation of semiconductor devices.

Description of the Related Art

As the device density increases, greater challenges for use of traditional external stressors in channel materials exist. A relaxed SiGe buffer can be used to induce tensile stress in silicon but no clear equivalent solution for compressive stress exists. SiGe layers can be very defective if above a critical thickness, implanted or subjected to a high thermal budget.

Strained silicon and strained silicon-on-insulator (SOI) can provide enhanced properties for semiconductor devices. For example, p-type field effect transistors (PFETs) have improved performance when formed with a compressive strain channel, and n-type field effect transistors (NFETs) have improved performance when formed with a tensile strain channel. Tensile strain devices are easily formed using, e.g., relaxed SiGe buffer layers or SiGe condensation. Compressively strained silicon is much more difficult to achieve.

SUMMARY

In accordance with an embodiment of the present invention, a method for inducing stress in a device channel includes forming a stress adjustment layer on a substrate, the stress adjustment layer including an as deposited stress due to crystal lattice differences with the substrate. A device channel layer is formed on the stress adjustment layer. Cuts are etched through the device channel layer and the stress adjustment layer to release the stress adjustment layer to induce stress in the device channel layer. Source/drain regions are formed adjacent to the device channel layer.

Another method for inducing stress in a device channel includes forming a stress adjustment layer on a substrate, the stress adjustment layer including an as deposited stress due to crystal lattice differences with the substrate; forming a device channel layer on the stress adjustment layer; forming fins in the device channel layer on the stress adjustment layer; forming gate structures transversely over the fins; etching cuts though the device channel layer and the stress adjustment layer on sides of the gate structures to release the stress adjustment layer to induce stress in the device channel layer; and forming source/drain regions adjacent to the device channel layer.

A semiconductor device having compressive stress in a device channel includes a stress adjustment layer formed on a substrate. A device channel layer is formed on the stress adjustment layer. The device channel layer includes a compressive stress induced by stress relaxation of the stress adjustment layer, which includes tensile stress from an as deposited stress provided from crystal lattice differences with the substrate. Source/drain regions are formed adjacent to the device channel layer.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein:

FIG. 1 is a cross-sectional view taken parallel to fins to be formed showing a device channel layer and a stress adjustment layer formed on a substrate in accordance with an embodiment of the present invention;

FIG. 2 is a cross-sectional view taken perpendicular to fins to be formed showing a device channel layer and a stress adjustment layer formed on a substrate in accordance with an embodiment of the present invention;

FIG. 3 is a cross-sectional view taken parallel to fins showing the device channel layer and the stress adjustment layer formed on the substrate in accordance with an embodiment of the present invention;

FIG. 4 is a cross-sectional view taken perpendicular to fins showing the fins etched into the device channel layer and the stress adjustment layer in accordance with an embodiment of the present invention;

FIG. 7 is a cross-sectional view taken parallel to fins showing cuts through the fins to release stress in the stress adjustment layer and induce stress in the device channel layer in accordance with an embodiment of the present invention;

FIG. 8 is a cross-sectional view of FIG. 7 taken perpendicular to the fins in accordance with an embodiment of the present invention;

FIG. 11 is a cross-sectional view taken parallel to fins to be formed showing device channel layers and stress adjustment layers of a nanosheet structure formed on a substrate in accordance with an embodiment of the present invention;

FIG. 12 is a cross-sectional view taken perpendicular to fins to be formed showing device channel layers and stress adjustment layers of the nanosheet structure formed on the substrate in accordance with an embodiment of the present invention;

FIG. 18 is a cross-sectional view taken parallel to fins showing source and drain regions formed over a protection layer in accordance with an embodiment of the present invention;

FIG. 19 is a cross-sectional view of FIG. 18 taken perpendicular to the fins showing source and drain regions formed in accordance with an embodiment of the present invention;

FIG. 20 is a cross-sectional view taken parallel to fins showing etch back of stress adjustment layers and formation of dielectric material for protection in accordance with another embodiment of the present invention;

FIG. 21 is a cross-sectional view of FIG. 18 taken parallel to the fins showing source and drain regions formed in accordance with an embodiment of the present invention;

FIG. 22 is a cross-sectional view taken parallel to fins showing a dielectric fill formed and dummy gate materials exposed by planarization in accordance with an embodiment of the present invention;

FIG. 23 is a cross-sectional view of FIG. 22 taken perpendicular to the fins showing the dielectric fill formed in accordance with an embodiment of the present invention;

DETAILED DESCRIPTION

Figure 5:
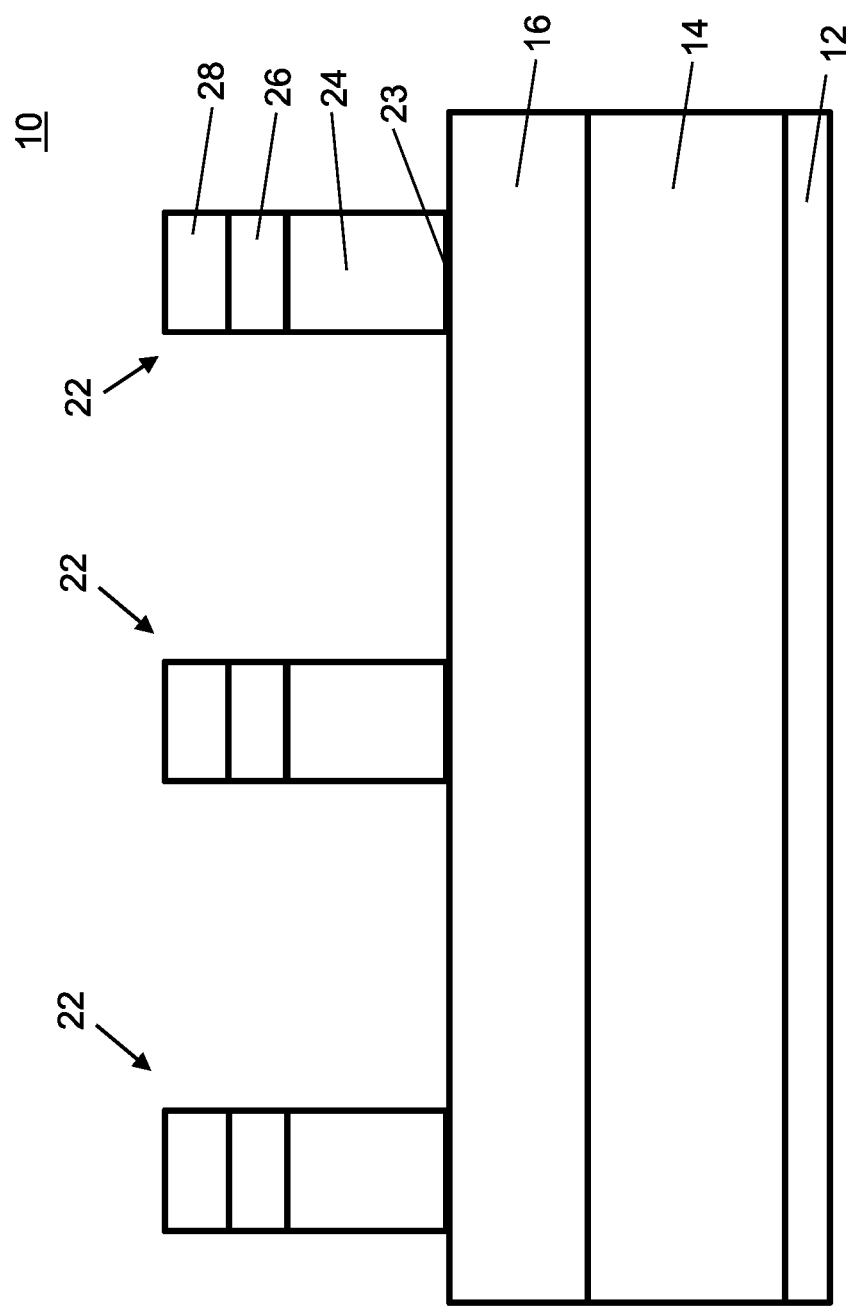
FIG. 5 is a cross-sectional view taken parallel to fins showing dummy gate structures formed over the fins in accordance with an embodiment of the present invention.

In accordance with aspects of the present invention, methods and structures are provided to form compressively strained structures. In some embodiments, one or more semiconductor layers or fin structures are rendered compressive. In one example, compressive properties can be applied to a semiconductor layer when a compound is inserted into a lattice of the semiconductor material to alter a lattice constant of the semiconductor material. The compound can include a material that is a crystalline compound and is preferably chemically bound with the material of the lattice. The compound can thus form a semiconductor crystal within a semiconductor matrix and affect the lattice constant of the overall layer.

In one embodiment, a tensily strained layer can be formed on a substrate to induce tension in an adjacent layer (e.g., device channel). The tensily strained layer may include $Si_3P_4$ on Si or SiC on Si, although other material combinations may be employed. The tensily strained layer is layered on the adjacent layer. The adjacent layer and the tensily strained layer are etched to elastically release the tensily strained layer to induce a compressive strain into the adjacent layer. The etched tensily strained layer and the adjacent layer can form a fin or form a channel region for another type of the field effect transistor (FET) device.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements. These compounds include different proportions of the elements within the compound. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Referring now to the drawings in which like numerals represent the same or similar elements and initially to FIGS. 1 and 2, a substrate system 10 is illustratively depicted in cross-section where the cross-section is taken parallel (\\) to the fins that will be formed. FIG. 2 shows the substrate system 10 illustratively depicted in cross-section where the cross-section is taken perpendicular ($\perp$) to the fins that will be formed.

The substrate system 10 includes a substrate 12 and a strain adjustment layer 14. The strain adjustment layer 14 is formed on the substrate 12 and includes an as deposited material that includes a different out of plane lattice parameter than the substrate 12. In particularly useful embodiments, the strain adjustment layer 14 includes a tensile stress/strain to induce a compressive strain in an adjacent or nearly adjacent device channel layer 16 as will be described. However, it should be understood that the present embodiments can apply to compressive materials to induce tensile stress/strains.

In one embodiment, the substrate 12 can include a silicon-based material, and, in particular, monocrystalline silicon (Si). The substrate 12 is not limited to monocrystalline forms of Si as other materials and multi-layers thereof may be employed.

Strain adjustment layer 14 is preferably formed on the substrate 12 by epitaxial growth. In one embodiment, strain adjustment layer 14 includes silicon phosphide ($Si_3P_4$) or silicon carbide (SiC). The strain adjustment layer 14 can be formed without relaxation. In one embodiment, the $Si_3P_4$ can be employed and include a thickness of about 50 nm or more while maintaining its tensile properties. Pseudocubic $Si_3P_4$ is a semiconductor with narrow bandgap material that has a much smaller lattice (a) than silicon ($a_{Si3P4}$=4.961 angstroms versus $a_{Si}$=5.431 angstroms). $Si_3P_4$ can be grown by epitaxy at low temperatures (e.g., less than about 700 degrees C.). A very high stress can be achieved as a blanket deposited layer 14 (e.g., greater than 1.6 GPa can be achieved).

The strain adjustment layer 14 is deposited on the substrate 12 with a smaller out of plane lattice parameter to eventually result in the inducement of a compressive stress/strain in the device channel layer 16. The device channel layer 16 is epitaxially grown on the strain adjustment layer 14, and can include the same material or a different material than the substrate 12. In one embodiment, the device channel layer 16 includes silicon (Si), silicon germanium (SiGe) or other crystalline materials.

A hard mask 18 is formed on the device channel layer 16. The hard mask 18 may include a nitride, such as, e.g., SiN, although other materials or multilayers may be employed.

Referring to FIGS. 3 and 4, the cross-section of FIG. 3 is taken parallel (\\) to a fin 20, and the cross-section of FIG. 4 is taken perpendicular ($\perp$) to the fins 20 that will be formed. Fins 20 are formed by patterning an etch mask (not shown) over the hard mask 18. The etch mask can include a photoresist or employ other patterning techniques, e.g., spacer image transfer, or the like. A reactive ion etch (RIE) or other etch process is performed to etch the device channel layer 16, the strain adjustment layer 14 and to etch slightly into the substrate 12. The hard mask 18 can be selectively removed during or after the etch process.

In FIG. 4, a dielectric layer 25 can be employed as a shallow trench isolation region between the fins 20. The dielectric layer 25 can be formed by blanket deposition of a dielectric (e.g., SiOx) everywhere on the wafer, planarization and recessing the dielectric 25 between the fins 20.

Referring to FIG. 5, dummy gate structures 22 are formed over the fins 20. The dummy gate structures 22 include a dummy gate oxide 23, a dummy gate 24, a gate cap 26 and a dielectric layer 28. The dummy gate oxide 23 can include a thermal or deposited oxide formed on the device channel layer 16. The dummy gate 24 can include polysilicon or amorphous silicon. The gate cap 26 can include silicon nitride, and the dielectric layer 28 can include silicon oxide. Other materials and multiple layers may also be employed. After the deposition of the dummy gate materials, a patterning process is employed to form the gate structures 22 by etching the dummy gate materials. The dummy gate structures 22 are formed perpendicularly to the fins 20.

Figure 6:
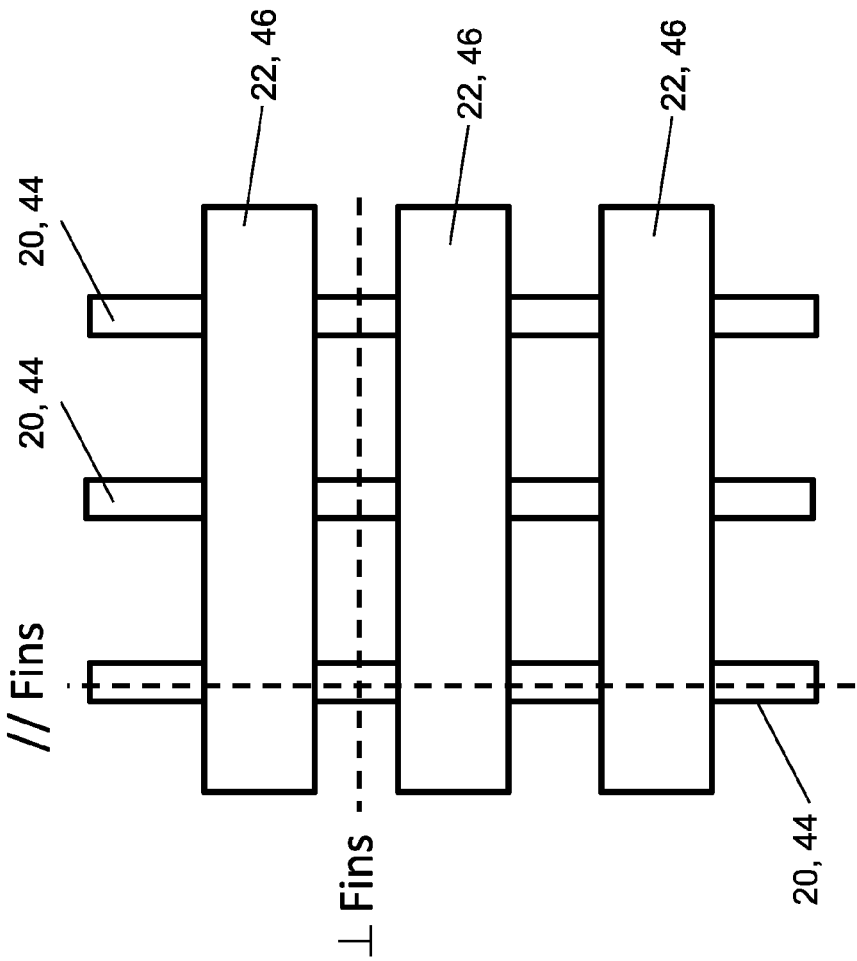
FIG. 6 is a schematic top view showing section lines for parallel and perpendicular fin views in accordance with an embodiment of the present invention.

Referring to FIG. 6, a schematic top view shows section lines for parallel to fins (\\ Fins) and perpendicular to fins (⊥ Fins) are shown for illustrative purposes. Gate structures 22, 46 are depicted transversely to the fins 22, 46.

Referring to FIGS. 7 and 8, a conformal spacer layer deposition is performed followed by a RIE process to form spacers 30. The spacers 30 can include silicon nitride or low K materials (e.g., SiBCN, SiOCN, SiON) although other suitable spacer materials can be employed. Using the dummy gate structures 22 and spacers 30 as an etch mask, an anisotropic etch process (e.g., RIE) is employed to cut the fins 20. The etch process etches through the device channel layer 16, the strain adjustment layer 14 and stops within the substrate 12 to ensure that the strain adjustment layer 14 is completely cut through. The strain adjustment layer 14 then begins to relax in the direction of arrows 32. This begins to induce stress/strain to the device channel layer 16 in contact with the strain adjustment layer 14. The remaining portions of the device channel layer 16 form a channel for a finFET device and are under compressive strain. The use of the compressive strain channel provides a benefit for p-type FET devices. In FIG. 8, the fin cut removes portions of the fins 20 down to the substrate and leaves trenches 36 through the dielectric layer 25.

Figure 9:
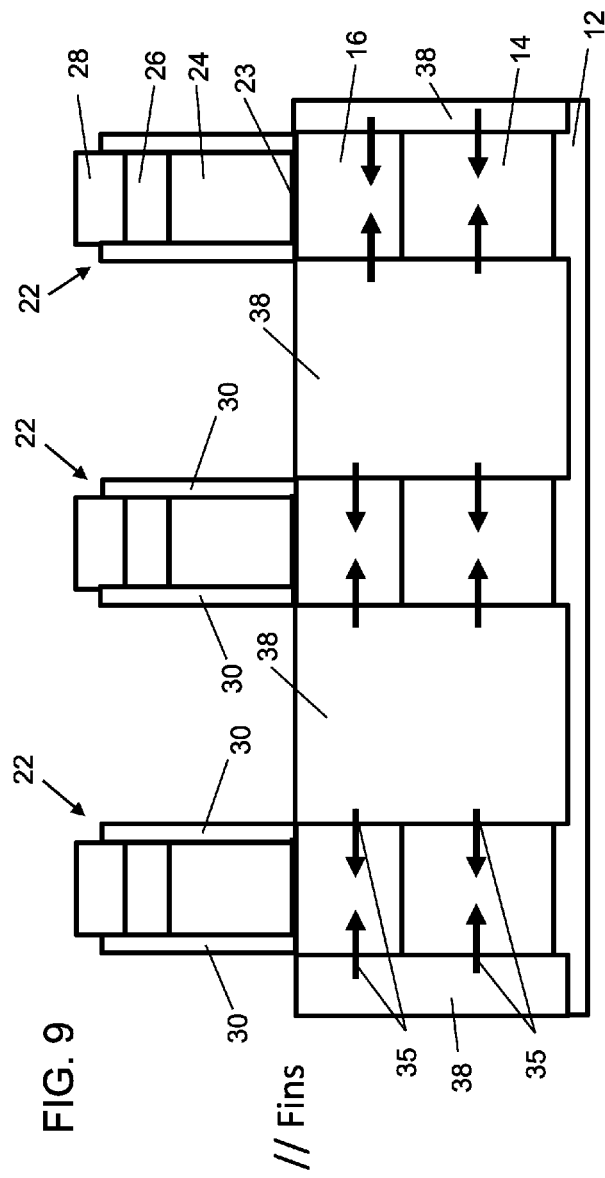
FIG. 9 is a cross-sectional view taken parallel to fins showing source and drain regions formed in accordance with an embodiment of the present invention.
Figure 10:
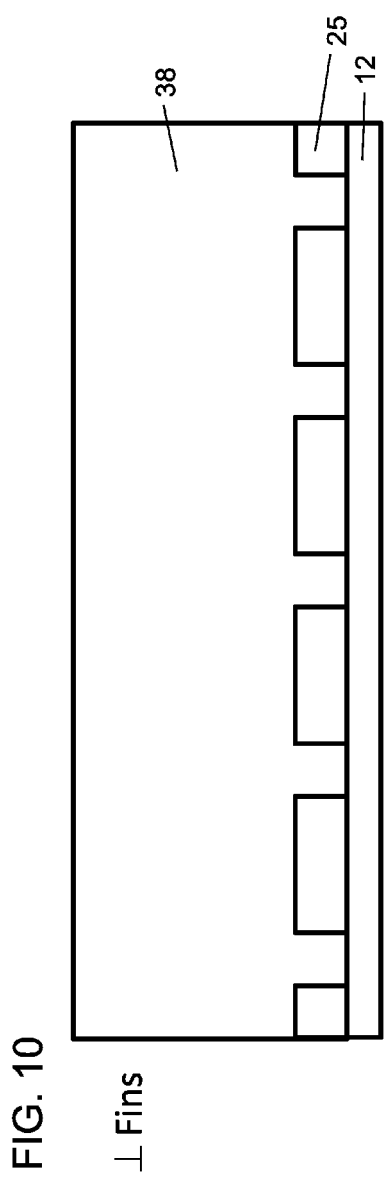
FIG. 10 is a cross-sectional view of FIG. 9 taken perpendicular to the fins showing source and drain regions formed in accordance with an embodiment of the present invention.

Referring to FIGS. 9 and 10, source/drain (S/D) regions 38 are formed. The S/D regions 38 can be epitaxially grown. In one useful embodiment, the S/D regions 38 can include materials that provide additional compressive stress (shown by arrows 35) in the channel region (adjacent layer 16). In one embodiment, the S/D regions 38 can include, e.g., boron doped silicon or SiGe:B to provide an additional external stressor.

Referring to FIGS. 11 and 12, a stacked nanosheet system 40 is illustratively depicted in cross-section in FIG. 11 where the cross-section is taken parallel (\\) to the fins that will be formed. FIG. 12 shows the stacked nanosheet system 40 illustratively depicted in cross-section where the cross-section is taken perpendicular (⊥) to the fins that will be formed.

A stacked nanosheet 42 is formed or provided on the strain adjustment layer 14, which is formed on the substrate 12. The strain adjustment layer 14 is formed on the substrate 12 and includes an "as deposited" material that includes a different out of plane lattice parameter than the substrate 12. In particularly useful embodiments, the strain adjustment layer 14 includes a tensile stress/strain to induce a compressive strain in the nanosheet 42, as will be described. However, it should be understood that the present embodiments can apply to compressive material to induce tensile stress/strain as well.

In one embodiment, the substrate 12 can include a silicon-based material, and, in particular, monocrystalline silicon (Si). The substrate 12 is not limited to monocrystalline forms of Si as other materials and multi-layers thereof may be employed. In one embodiment, the stacked nanosheet 42 can include stacked nanowires instead of a sheet.

Strain adjustment layer 14 is preferably formed on the substrate 12 by epitaxial growth. In one embodiment, strain adjustment layer 14 includes $Si_3P_4$ or SiC. The strain adjustment layer 14 can be formed without relaxation. In one embodiment, the $Si_3P_4$ can be employed and include a thickness of about 50 nm or more while maintaining its tensile properties. The strain adjustment layer 14 is deposited on the substrate 12 with a smaller out of plane lattice parameter to eventually result in the inducement of a compressive stress/strain in the device channel layer 16. The nanosheet 42 is epitaxially grown and provided on the strain adjustment layer 14. The nanosheet 42 includes alternating layers 16, 17 of monocrystalline materials. Layers 16 can include the same material or a different material than the substrate 12. Layers 16 will eventually form a compressed device channel. In one embodiment, the layers 16 include silicon (Si), silicon germanium (SiGe) or other crystalline materials. Layers 17 of the nanosheet 42 may include the same material as the strain adjustment layer 14 (e.g., $Si_3P_4$, SiC). A hard mask 18 is formed on the nanosheet 42. The hard mask 18 may include a nitride, such as, e.g., SiN, although other materials or multilayers may be employed.

Figure 13:
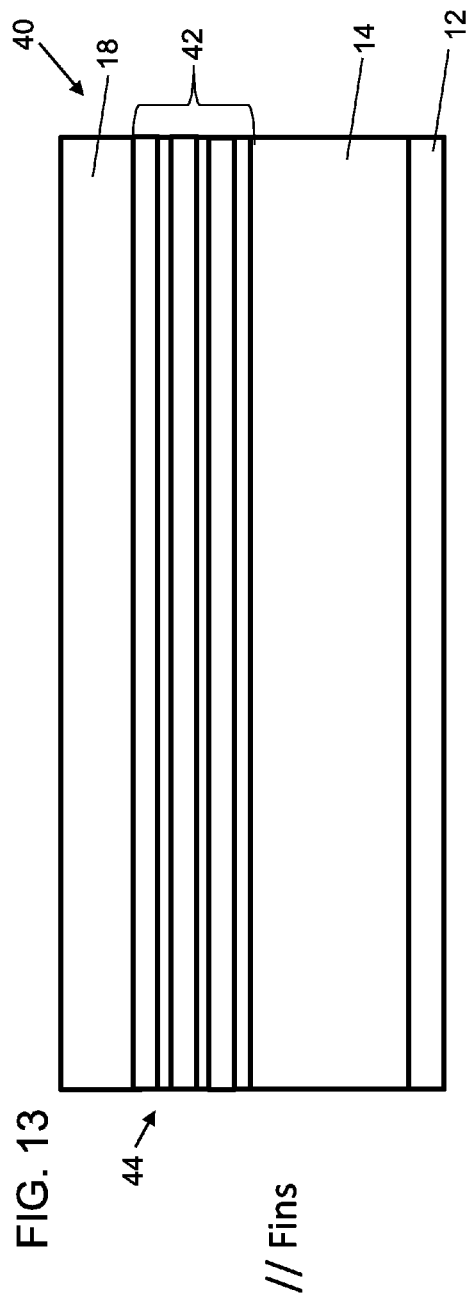
FIG. 13 is a cross-sectional view taken parallel to fins showing the device channel layers and the stress adjustment layers of the nanosheet structure formed on the substrate in accordance with an embodiment of the present invention.
Figure 14:
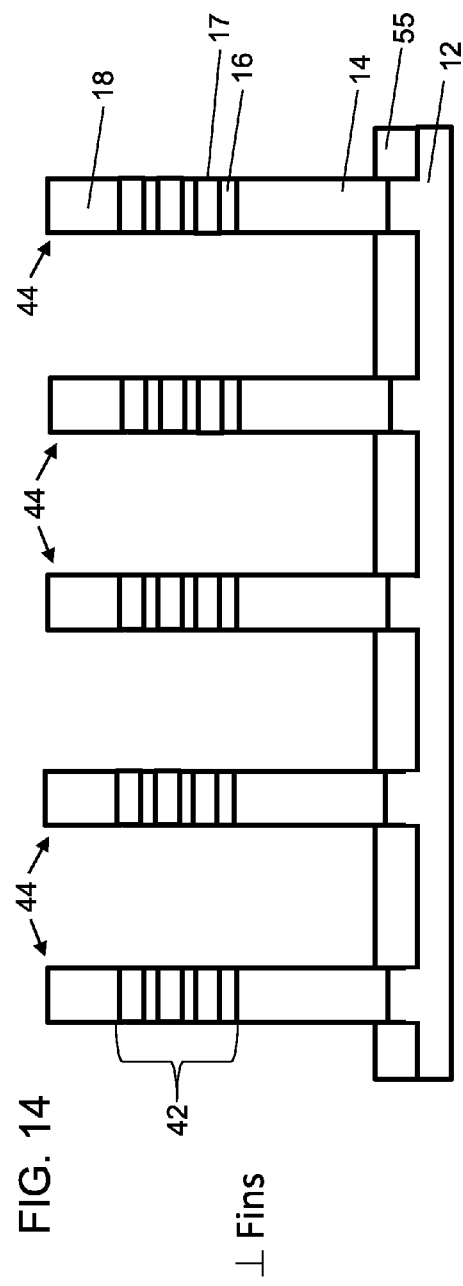
FIG. 14 is a cross-sectional view taken perpendicular to fins showing the fins etched through the device channel layers and the stress adjustment layers of the nanosheet structure in accordance with an embodiment of the present invention.

Referring to FIGS. 13 and 14, the cross-section of FIG. 13 is taken parallel (\\) to a fin 44, and the cross-section of FIG. 14 is taken perpendicular (⊥) to the fins 44 that will be formed. Fins 44 are formed by patterning an etch mask (not shown) over the hard mask 18. The etch mask can include a photoresist or employ other patterning techniques, e.g., spacer image transfer, or the like. A RIE or other etch process is performed to etch the nanosheet 42, to etch the strain adjustment layer 14 and to etch slightly into the substrate 12. The hard mask 18 can be selectively removed during or after the etch process.

In FIG. 14, a dielectric layer 55 can be employed as a shallow trench isolation region between the fins 44. The dielectric layer 55 can be formed by blanket deposition of a dielectric (e.g., SiOx) everywhere on the wafer, planarization and recess between the fins 20.

Figure 15:
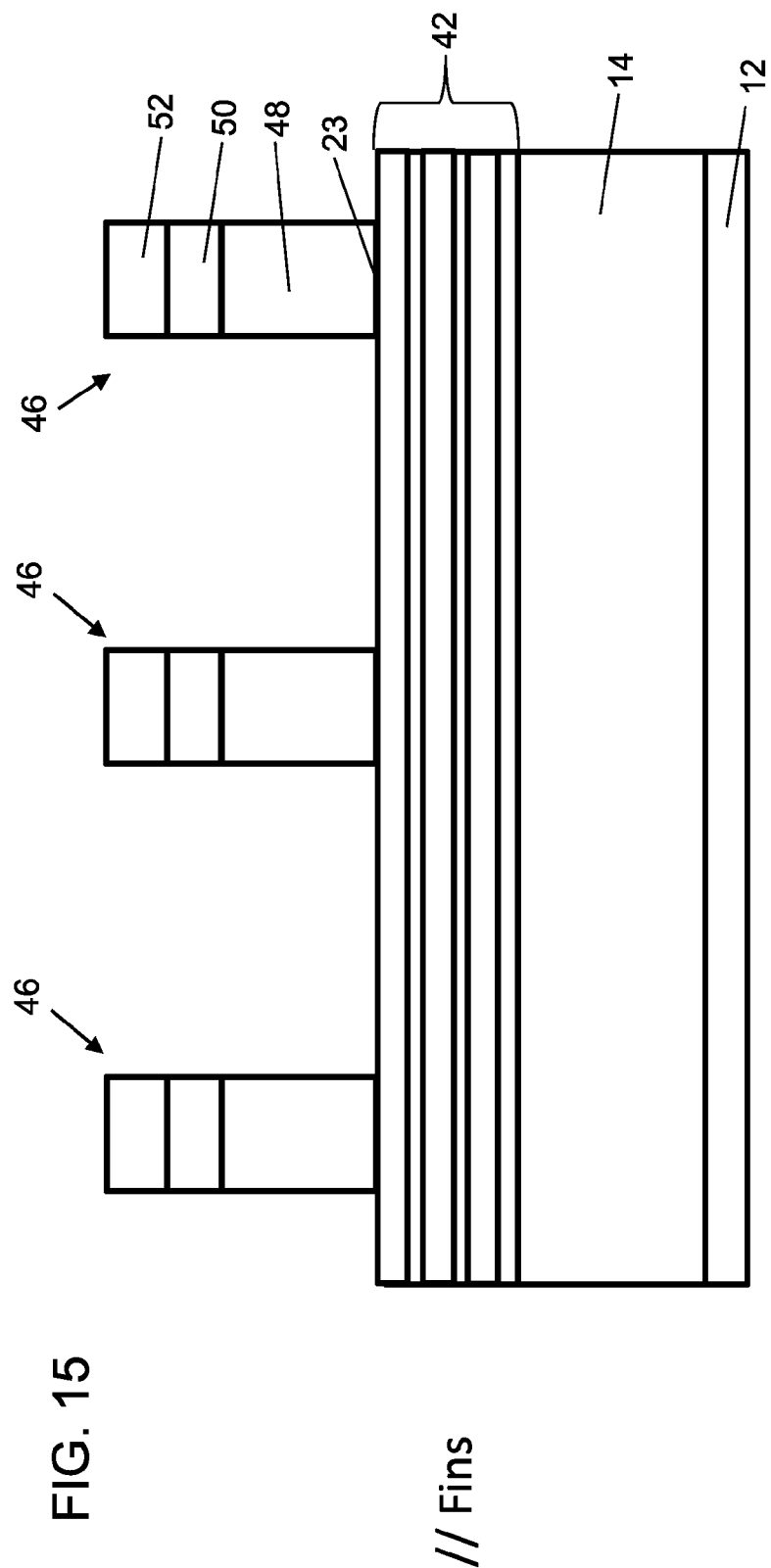
FIG. 15 is a cross-sectional view taken parallel to fins showing dummy gate structures formed over the fins in accordance with an embodiment of the present invention.

Referring to FIG. 15, dummy gate structures 46 are formed over the fins 44. The dummy gate structures 46 include a dummy gate oxide 23, a dummy gate 48, a gate cap 50 and a dielectric layer 52. The dummy gate oxide 23 can include a thermal oxide formed on a top most layer of the nanosheet 42. The dummy gate 48 can include polysilicon or amorphous silicon. The gate cap 50 can include silicon nitride, and the dielectric layer 52 can include silicon oxide. Other materials and multiple layers may also be employed. After the deposition of the dummy gate materials, a patterning process is employed to form the gate structures 46 by etching the dummy gate materials. The dummy gate structures 46 are formed perpendicularly to the fins 44.

Figures 16, 17:
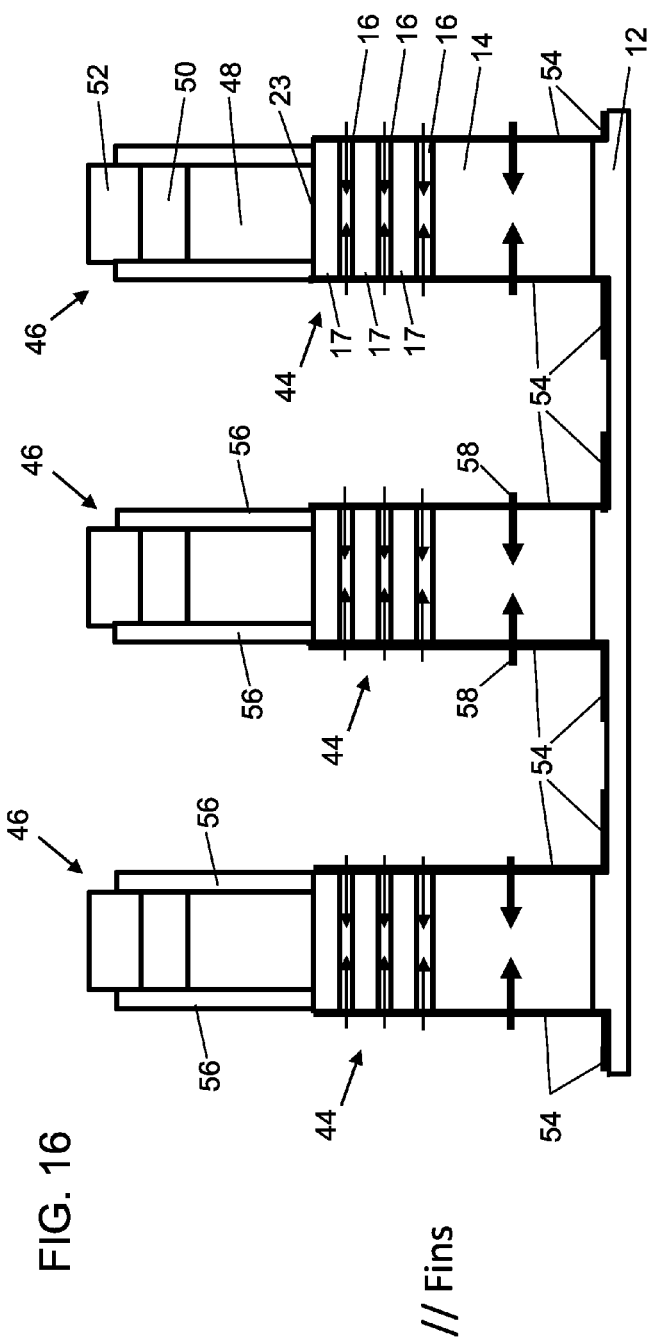
FIG. 16 is a cross-sectional view taken parallel to fins showing cuts through the fins to release stress in the stress adjustment layers and induce stress in the device channel layers in accordance with an embodiment of the present invention.
FIG. 17 is a cross-sectional view of FIG. 16 taken perpendicular to the fins in accordance with an embodiment of the present invention.

Referring to FIGS. 16 and 17, a conformal spacer layer deposition is performed followed by a RIE process to form spacers 56. The spacers 56 can include silicon nitride, although other suitable spacer materials can be employed. Using the dummy gate structures 46 and spacers 56 as an etch mask, an anisotropic etch process (e.g., RIE) is employed to cut the fins 44. The etch process etches through the nanosheet 42, the strain adjustment layer 14 and stops within the substrate 12 to ensure that the strain adjustment layer 14 is completely cut through. The strain adjustment layer 14 and layers 17 then begin to relax in the direction of arrows 58. This begins to induce stress/strain to the layers 16 in contact with the strain adjustment layer 14 and layers 17. The remaining portions of the layers 16 form a channel for a finFET device and are under compressive strain. The use of the compressive strain channel provides a benefit for p-type FET devices.

In one embodiment, a thin protective liner 54 is deposited in contact with sidewalls of the fins 44 and over exposed surfaces of the substrate 12. The thin protective liner 54 can include a crystalline semiconductor material such as, e.g., silicon (Si). The thin protective liner 54 may be omitted in favor of other protective measures as will be described. The thin protective liner 54 prevents lateral etching into the fins 44 during the formation of the nanosheets and final metal gate in the subsequent steps. In FIG. 17, the fin cut removes portions of the fins 44 down to the substrate 12 and leaves trenches 60 through the dielectric layer 55.

Referring to FIGS. 18 and 19, source/drain (S/D) regions 62 are formed. The S/D regions 62 can be epitaxially grown on the substrate 12 and the protection layer 54. In one useful embodiment, the S/D regions 62 can include a material that provides additional compressive stress in the channel region 16. In one embodiment, the S/D regions 62 can include, e.g., boron doped silicon or SiGe:B to provide an additional external stressor.

Referring to FIG. 20, in another embodiment, instead of forming the thin protective liner 54 and before forming S/D regions 62, a selective etch process is performed to etchback (recess) lateral portions of the layers 17 and layer 14 of the fins 44. The selective etch can include a wet or dry etch. Then, a dielectric material 64 is deposited to provide gate isolation from the S/D regions 62 to be formed by filling in the recessed regions. A RIE or wet etch process is performed to remove the remaining dielectric material 64 and leave behind dielectric material 64. The dielectric material 64 prevents lateral etching into the fins 44 during the formation of the nanosheets and final metal gate in the subsequent steps. The dielectric material 64 can include a low dielectric constant material (e.g., equal to or less than the dielectric constant of silicon oxide) to provide preferred capacitance characteristics between the gate and S/D regions.

Referring to FIG. 21, the S/D regions 62 can be epitaxially grown. In one useful embodiment, the S/D regions 62 can include a material that provides additional compressive stress in the channel region (layers 16). In one embodiment, the S/D regions 62 can include, e.g., boron doped silicon or SiGe:B to provide an additional external stressor.

Referring to FIGS. 22 and 23, while the embodiments of either FIG. 18 or FIG. 21 can be employed, additional processing will be described in terms of the embodiments of FIG. 21. Such processing is applicable to either embodiment.

A dielectric fill 66 is deposited over device to fill in spaces between the gate structures 46. The dielectric fill 66 can include a form of oxide, e.g., a silicon oxide, although any suitable dielectric material can be employed. A planarization process, such as, e.g., a chemical mechanical polish (CMP), is performed to expose the dummy gate 48.

Figure 24:
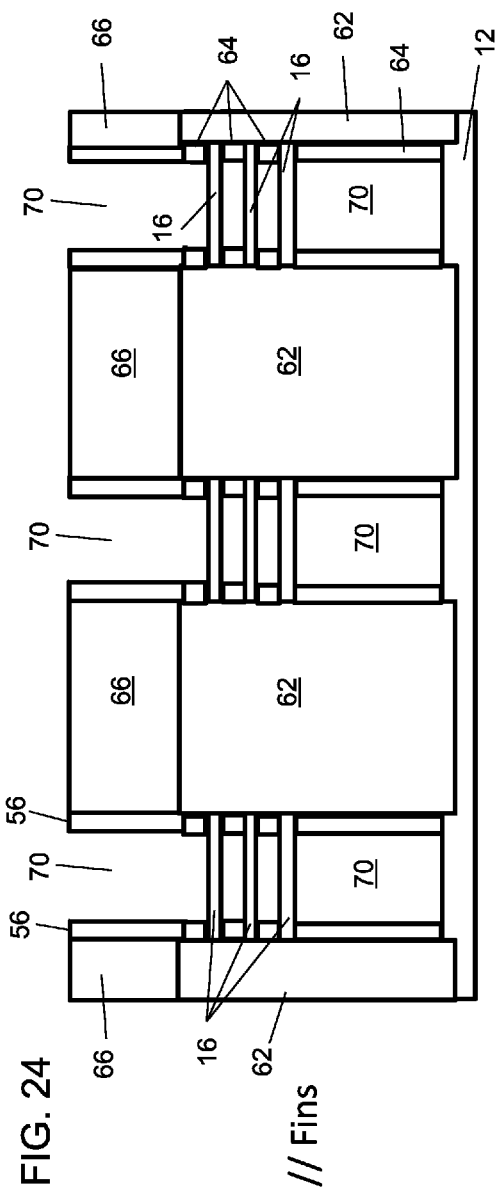
FIG. 24 is a cross-sectional view taken parallel to fins showing the dummy gate and the stress adjustment layers selectively removed to expose the device channel layers in accordance with an embodiment of the present invention.
Figure 25:
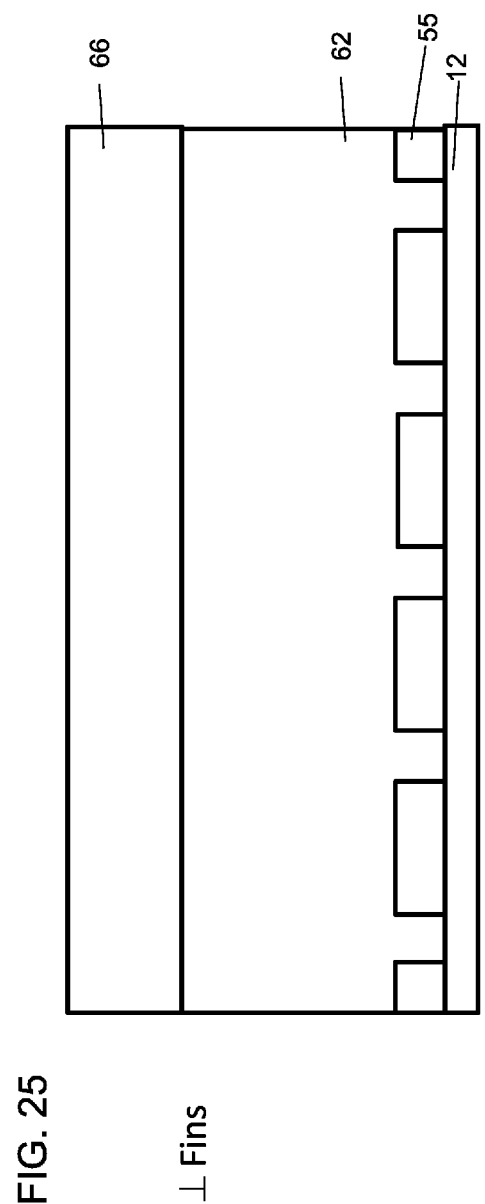
FIG. 25 is a cross-sectional view of FIG. 24 taken perpendicular to the fins showing the dielectric fill formed in accordance with an embodiment of the present invention.

Referring to FIGS. 24 and 25, the dummy gate 48 and the strain adjustment layers 14 and 17 are removed to form a void 70 and expose layers 16. The layers 16 extend between the S/D regions 62. The layers 16 are in effect clamped between the S/D regions 62. There is little or no relaxation of the compressive stress in the channel region (layers 16) as the channel region (layers 16) is clamped by the S/D region epitaxy on both sides.

Figure 26:
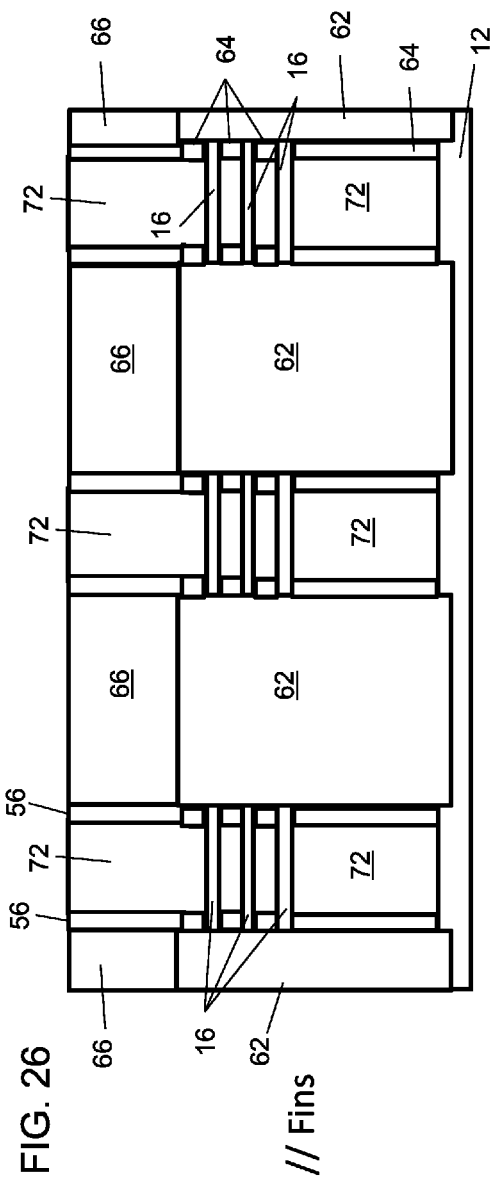
FIG. 26 is a cross-sectional view taken parallel to fins showing a gate stack formed in a void in accordance with an embodiment of the present invention.
Figure 27:
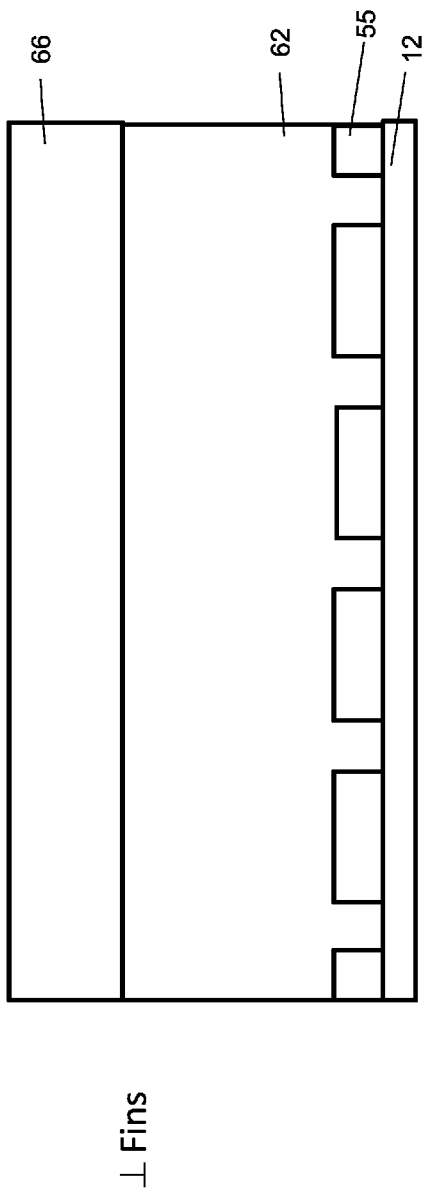
FIG. 27 is a cross-sectional view of FIG. 26 taken perpendicular to the fins showing the dielectric fill formed in accordance with an embodiment of the present invention.

Referring to FIGS. 26 and 27, the layers 16 form a device channel between S/D regions 62. The layers 16 have a gate dielectric (not shown) formed thereon and the voids 70 are filled with a conductive material 72 to form a gate electrode. The conductive material 72 can include a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tungsten silicide, tungsten nitride, ruthenium oxide, cobalt silicide, nickel silicide), carbon nanotube, conductive carbon, graphene, or any suitable combination of these materials. The conductive material may further comprise dopants that are incorporated during or after deposition. Processing continues with the formation of additional components and structures to complete the device, e.g., contacts, metal lines, etc.

Having described preferred embodiments for stress induction in 3D device channels using elastic relaxation of high stress material (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for inducing stress in a device channel, comprising:
    forming a stress adjustment layer, formed from a material including silicon phosphide ($Si_3P_4$), on a substrate, the stress adjustment layer including an as deposited stress due to crystal lattice differences with the substrate;
    forming a device channel layer on the stress adjustment layer;
    etching cuts though the device channel layer and the stress adjustment layer to release the stress adjustment layer to induce stress in the device channel layer and form a fin such that the stress adjustment layer extends through the fin from the device channel layer to the substrate; and
    forming source/drain regions adjacent to the device channel layer.

2. The method as recited in claim 1, wherein the stress adjustment layer includes a tensile stress to form a compressive stress in the device channel layer.

3. The method as recited in claim 1, wherein the device channel layer includes a material selected from the group consisting of silicon (Si) and silicon germanium (SiGe).

4. The method as recited in claim 1, wherein forming the source/drain regions adjacent to the device channel layer includes forming stressed source/drain regions to externally provide additional stress to the device channel layer.

5. The method as recited in claim 1, wherein the device channel layer includes a fin.

6. The method as recited in claim 1, wherein the device channel layer includes layers in a nanosheet.

7. A method for inducing stress in a device channel, comprising:
    forming a stress adjustment layer, formed from a material including silicon phosphide ($Si_3P_4$), on a substrate, the stress adjustment layer including an as deposited stress due to crystal lattice differences with the substrate;
    forming a device channel layer on the stress adjustment layer;
    forming fins in the device channel layer on the stress adjustment layer such that the stress adjustment layer extends through the fin from the device channel layer to the substrate;
    forming gate structures transversely over the fins;
    etching cuts though the device channel layer and the stress adjustment layer on sides of the gate structures to release the stress adjustment layer to induce stress in the device channel layer; and forming source/drain regions adjacent to the device channel layer.

8. The method as recited in claim 7, wherein the stress adjustment layer includes a tensile stress to form a compressive stress in the device channel layer.

9. The method as recited in claim 7, wherein the device channel layer includes a material selected from the group consisting of silicon (Si) and silicon germanium (SiGe).

10. The method as recited in claim 7, wherein forming the source/drain regions adjacent to the device channel layer includes forming stressed source/drain regions to externally provide additional stress to the device channel layer.

11. The method as recited in claim 7, wherein the device channel layer includes a multi-layered nanosheet including alternating layers of channel layers and stress adjustment layers.

12. The method as recited in claim 11, further comprising forming a protection layer along sidewalls of the fins before forming the source/drain regions.

13. The method as recited in claim 11, further comprising:
recessing the alternating stress adjustment layers and the stress adjustment layer; and
depositing a dielectric material in the recesses to protect sidewalls of the fins before forming the source/drain regions.

14. The method as recited in claim 11, further comprising:
removing the alternating stress adjustment layers and the stress adjustment layer to form a void and to expose the alternating channel layers such that the alternating channel layers are clamped between the source/drain regions to maintain stress; and
forming gate material to fill the void.

15. A semiconductor device having compressive stress in a device channel, comprising:
a stress adjustment layer, formed from a material including silicon phosphide ($Si_3P_4$), formed on a substrate;
a device channel layer formed on the stress adjustment layer, the device channel layer including a compressive stress induced by stress relaxation of the stress adjustment layer, which includes tensile stress from an as deposited stress provided from crystal lattice differences with the substrate and the stress adjustment layer and the device channel layer forming a fin such that the stress adjustment layer extends through the fin from the device channel layer to the substrate; and
source/drain regions formed adjacent to the device channel layer.

16. The device as recited in claim 15, wherein the device channel layer includes a material selected from the group consisting of silicon (Si) and silicon germanium (SiGe).

17. The device as recited in claim 15, wherein the source/drain regions externally provide additional stress to the device channel layer.

18. The method as recited in claim 15, wherein the device channel layer includes a fin or layers in a nanosheet.

* * * * *